United States Patent
Richter

(10) Patent No.: US 8,349,740 B2
(45) Date of Patent: Jan. 8, 2013

(54) REDUCED TOPOGRAPHY-RELATED IRREGULARITIES DURING THE PATTERNING OF TWO DIFFERENT STRESS-INDUCING LAYERS IN THE CONTACT LEVEL OF A SEMICONDUCTOR DEVICE

(75) Inventor: Ralf Richter, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 346 days.

(21) Appl. No.: 12/623,493

(22) Filed: Nov. 23, 2009

(65) Prior Publication Data

US 2010/0133620 A1    Jun. 3, 2010

(30) Foreign Application Priority Data

Nov. 26, 2008  (DE) .................. 10 2008 059 649

(51) Int. Cl.
*H01L 21/311* (2006.01)
(52) U.S. Cl. ......... 438/694; 438/695; 438/696; 257/327
(58) Field of Classification Search .......... 438/694–696; 257/327
See application file for complete search history.

(56) References Cited

U.S. PATENT DOCUMENTS

| | | | |
|---|---|---|---|
| 2005/0218455 A1 | 10/2005 | Maeda et al. | 257/368 |
| 2006/0046400 A1* | 3/2006 | Burbach et al. | 438/282 |
| 2006/0226490 A1 | 10/2006 | Burnett et al. | 257/365 |
| 2007/0085151 A1 | 4/2007 | Kotani | 257/393 |
| 2007/0235823 A1* | 10/2007 | Hsu et al. | 257/411 |
| 2008/0003734 A1 | 1/2008 | Chuang et al. | 438/199 |
| 2008/0179661 A1 | 7/2008 | Richter et al. | 257/327 |
| 2008/0237659 A1 | 10/2008 | Yang | 257/288 |
| 2008/0237726 A1 | 10/2008 | Dyer | 257/369 |

FOREIGN PATENT DOCUMENTS

| | | |
|---|---|---|
| JP | 2007324329 | 12/2007 |
| WO | WO 2006/107413 A2 | 10/2006 |
| WO | WO 2008/150410 A1 | 12/2008 |

OTHER PUBLICATIONS

Translation of Official Communication from German Patent Office for German Patent Application No. 10 2008 059 649.3 dated Oct. 6, 2009.
PCT Search Report and Written Opinion from PCT/US2009/006279 dated Feb. 18, 2010.
Translation of Official Communication from German Patent Office for German Patent Application No. 10 2008 059 649.3 dated Mar. 1, 2012.

* cited by examiner

*Primary Examiner* — Telly Green
(74) *Attorney, Agent, or Firm* — Williams, Morgan & Amerson, P.C.

(57) ABSTRACT

In sophisticated semiconductor devices, stress-inducing materials may be provided above the basic transistor devices without any etch control or etch stop materials, thereby enabling an efficient de-escalation of the surface topography, in particular above field regions including closely spaced polysilicon lines. Furthermore, an additional stress-inducing material may be provided on the basis of the superior surface topography, thereby providing a highly efficient strain-inducing mechanism in performance-driven transistor elements.

11 Claims, 10 Drawing Sheets

REDUCED TOPOGRAPHY-RELATED IRREGULARITIES DURING THE PATTERNING OF TWO DIFFERENT STRESS-INDUCING LAYERS IN THE CONTACT LEVEL OF A SEMICONDUCTOR DEVICE

BACKGROUND OF THE INVENTION

1. Field of the Invention

Generally, the present disclosure relates to the field of integrated circuits, and, more particularly, to field effect transistors and manufacturing techniques on the basis of stressed dielectric layers formed above the transistors and used for generating a different type of strain in channel regions of different transistor types.

2. Description of the Related Art

Integrated circuits are typically comprised of a large number of circuit elements located on a given chip area according to a specified circuit layout, wherein, in complex circuits, the field effect transistor represents one predominant circuit element. Generally, a plurality of process technologies for advanced semiconductor devices are currently practiced, wherein, for complex circuitry based on field effect transistors, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the reduction of the channel length, and associated therewith the reduction of the channel resistivity, may be a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One issue associated with reduced gate lengths is the occurrence of so-called short channel effects, which may result in a reduced controllability of the channel conductivity. Short channel effects may be countered by certain design techniques, some of which, however, may be accompanied by a reduction of the channel conductivity, thereby partially offsetting the advantages obtained by the reduction of critical dimensions.

In view of this situation, it has been proposed to enhance device performance of the transistor elements not only by reducing the transistor dimensions but also by increasing the charge carrier mobility in the channel region for a given channel length, thereby increasing the drive current capability and thus transistor performance. For example, the lattice structure in the channel region may be modified, for instance, by creating tensile or compressive strain therein, which results in a modified mobility for electrons and holes, respectively. For example, creating tensile strain in the channel region of a silicon layer having a standard crystallographic configuration may increase the mobility of electrons, which in turn may directly translate into a corresponding increase of the conductivity of N-type transistors. On the other hand, compressive strain in the channel region may increase the mobility of holes, thereby providing the potential for enhancing the performance of P-type transistors.

One efficient approach in this respect is a technique that enables the creation of desired stress conditions within the channel region of different transistor elements by adjusting the stress characteristics of a dielectric layer stack that is formed above the basic transistor structure. The dielectric layer stack typically comprises one or more dielectric layers which may be located close to the transistor and which may also be used in controlling a respective etch process in order to form contact openings to the gate and drain and source terminals. Therefore, an effective control of mechanical stress in the channel regions, i.e., effective stress engineering, may be accomplished by individually adjusting the internal stress of these layers, which may also be referred to as contact etch stop layers, and by positioning a contact etch stop layer having an internal compressive stress above a P-channel transistor while positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition (PECVD) processes above the transistor, i.e., above the gate structure and the drain and source regions, wherein, for instance, silicon nitride may be used, due to its high etch selectivity with respect to silicon dioxide, which is a well-established interlayer dielectric material. Furthermore, PECVD silicon nitride may be deposited with a high intrinsic stress, for example, up to 2 Giga Pascal (GPa) or significantly higher of compressive stress and up to 1 GPa and significantly higher of tensile stress, wherein the type and the magnitude of the intrinsic stress may be efficiently adjusted by selecting appropriate deposition parameters. For example, ion bombardment, deposition pressure, substrate temperature, gas flow rates and the like represent respective parameters that may be used for obtaining the desired intrinsic stress.

During the formation of the two types of stressed layers, conventional techniques, also referred to as dual stress liner approaches, may suffer from reduced efficiency when device dimensions are increasingly scaled by using the 45 nm technology and even further advanced approaches, due to the limited conformal deposition capabilities of the deposition processes involved, which may result in respective process non-uniformities during subsequent process steps for patterning the stressed layer and forming contact openings, as will be explained in more detail with reference to FIGS. 1a-1d.

FIG. 1a schematically illustrates a top view of a semiconductor device 100 comprising a first device region 120A and a second device region 120B. The first and second device regions 120A, 120B may represent device regions in which closely spaced transistor elements have to be formed, which may comprise gate electrodes 121 in the form of conductive polysilicon lines, which may extend above a semiconductor layer 102 which may, for instance, at the first device region 120A, represent the active regions for P-channel transistors, while the semiconductor layer 102 may represent an N-active region in the device region 120B. The gate electrode structures 121 may also extend above an isolation region 103, for instance in the form of an appropriate dielectric material, such as silicon dioxide and the like, which may also be indicated as a field region.

FIG. 1b schematically illustrates a cross-sectional view of the semiconductor device 100 in a certain manufacturing stage for forming stress-inducing layers above the first device area 120A and the second device area 120B. The cross-sectional view is taken along the line Ib-Ib of FIG. 1a and hence the specific transistor configuration within the semiconductor layer is not illustrated, since, according to the cross-section of FIG. 1b, the gate electrodes are shown above the isolation structure 103. The first and second device areas 120A, 120B, which typically represent respective transistor elements, may be formed above a substrate 101 comprising the semiconductor layer 102, such as a silicon-based layer, which may be separated from a substrate 101 by an appropriate buried insulating layer (not shown) if a silicon-on-insulator (SOI) configuration is considered. In the example shown, the first and second device areas 120A, 120B may comprise a plurality of transistor elements with a lateral distance according to the design rules of the technology under consideration. The transistors in the first and second device areas 120A, 120B may comprise the gate electrodes 121 formed on respective gate insulation layers (not shown), which separate the gate electrodes 121 from a corresponding channel region in the semiconductor layer 102, which is laterally located between respective drain/source regions. Furthermore, a sidewall spacer structure 122 may be formed on sidewalls of the gate electrode 121. Typically, metal silicide regions (not shown) may be provided in the drain and source regions and the gate electrodes 121 in order to enhance the conductivity of these areas. Furthermore, the isolation region or field region 103 may be recessed in the region 120B and to a lesser degree also in the region 120A, as indicated by 103B, 103A, respectively. The semiconductor device 100 may represent an advanced device, in which critical dimensions, such as the gate length, i.e., in FIG. 1b, the horizontal extension of the gate electrodes 121, may be approximately 50 nm or significantly less. Consequently, a distance between respective transistor elements, i.e., the lateral distance between neighboring sidewall spacer structures 122 of closely spaced gate electrodes 121, as shown in the device region 120B, may be approximately 100 nm or even less.

Furthermore, in the manufacturing stage shown in FIG. 1b, a silicon nitride layer 130, comprising, for instance, a high intrinsic tensile stress, is formed above the first and second device areas 120A, 120B, followed by an etch stop layer 131 comprised of silicon dioxide. It should be appreciated that, if required, an etch stop layer 133, such as a silicon dioxide layer of appropriate thickness and density, may be provided between the silicon nitride layer 130 and the respective transistor elements in the first and second device areas 120A, 120B. The etch stop layer 131 is typically provided with a thickness that is sufficient to stop an etch process in a later stage when patterning the layer 130, or to provide a pronounced endpoint detection signal. That is, a silicon nitride etch chemistry reacting with silicon dioxide results in a specific plasma ambient that can be detected by standard detection techniques. Usually, a thickness of the etch indicator layer 131 is selected to be approximately 20 nm or more, thereby providing sufficient etch stop capabilities across the substrate in order to reliably control the respective etch process. In some approaches, the etch indicator layer 131 may act as a hard mask during the patterning of the silicon nitride layer 130.

As is evident from FIG. 1b, due to the reduced spacing between neighboring gate electrodes, and thus transistor elements, above the semiconductor layer and the recesses 103B, 103A, the silicon nitride layer 130 may have to be deposited on the basis of a pronounced aspect ratio, in particular in the second region 120B due to the recess 103B.

Furthermore, in this manufacturing stage, the semiconductor device 100 may comprise a resist mask 104 exposing the second device area 120B, while covering the first device region 120A. In this case, it may be assumed that the intrinsic stress of the silicon nitride layer 130 may be appropriately selected so as to enhance the transistor performance in the first device area 120A, which in the present example represents an N-region.

A typical process flow for forming the semiconductor device 100 as shown in FIG. 1b may comprise the following processes. The gate electrodes 121 and the gate insulation layers may be formed and patterned on the basis of well-established process techniques, including advanced photolithography, deposition, oxidation and etch techniques.

As previously explained, in sophisticated applications, strain-inducing mechanisms may be implemented, for instance, in the form of a silicon germanium material provided in drain and source areas in a strained state, thereby also inducing a corresponding compressive strain in the adjacent channel region of P-channel transistors. Thus, in some cases, the N-region 120A may be covered by an appropriate etch mask while the P-region 120B may obtain appropriate sidewall spacer elements after forming the gate electrode in order to determine an offset of cavities to be etched into the semiconductor layer 102 in the region 120B. During the corresponding patterning process, material of the isolation structure 103 may be removed, thereby increasingly forming the recess 103B, which may further be deepened by the etch processes, cleaning processes and the like, which may also create the recess 103A in the first device region 120A.

Thereafter, the drain and source regions may be formed in combination with the sidewall spacer structures 122 on the basis of well-established deposition, anisotropic etch processes and implantation sequences in order to establish the desired vertical and lateral dopant profile. Thereafter, respective silicide regions may be formed, if required, on the basis of well-established techniques. Next, if required, a corresponding silicon dioxide etch stop layer may be formed, followed by the deposition of the silicon nitride layer 130. During the deposition of the silicon nitride material, respective process parameters, such as composition of carrier gases and reactive gases, substrate temperature, deposition pressure and in particular ion bombardment during the deposition, may significantly influence the finally obtained intrinsic stress of the material as deposited with respect to the underlying materials. Thus, by selecting appropriate parameter values, a high degree of intrinsic stress, such as up to 2 Gigapascal (GPa) and even more of compressive stress or up to 1 GPa or even significantly higher of tensile stress, may be created so as to enhance the performance of the transistor in the first device area 120A. Due to the less pronounced conformality of the silicon nitride deposition process above a certain layer thickness and for increased aspect ratios, as may be encountered in particular above the isolation region 103 of highly scaled devices caused by the reduced distance between the neighboring transistor elements at moderately dimensioned gate heights and the recesses 103B, 103A, as shown, the thickness of the silicon nitride material is selected so as to avoid irregularities, such as voids.

After the deposition of the silicon dioxide layer 131, the resist mask 104 may be formed on the basis of well-established photolithography techniques. Next, an appropriately designed etch process may be performed in order to remove a portion of the layers 130 and 131 from the device area 120B. During the corresponding etch process, the silicon dioxide material of the layer 131 may be removed first followed by a selective etch process for removing the material of the silicon nitride layer 130, wherein the corresponding etch process may be controlled on the basis of the etch stop layer 133.

FIG. 1c schematically illustrates the semiconductor device 100 at a further advanced manufacturing stage. As shown, a second dielectric layer 140 may be formed above the first and second device areas 120A, 120B, wherein a void 132 may be present in the second device area 120B due to the limited gap filling capability of the deposition process for forming a highly stressed silicon nitride material and the pronounced surface topography. The void 132 in the second device region 120B may result in degraded etch uniformity during the subsequent processing, thereby resulting in a significant yield loss. For example, in a later stage, contacts may have to be formed that connect to a portion of the gate electrodes 121 positioned above the isolation or field regions 103 and also to drain and source regions formed in the active regions enclosed by the isolation region 103. In this common patterning sequence, the void 132 may thus contribute to significant yield losses due to non-reliable contacts, short circuits between the drain or source region and the channel region, and the like.

Furthermore, at the manufacturing stage shown in FIG. 1c, a corresponding resist mask 104A is provided to protect the dielectric layer 140 during a corresponding etch process for removing the exposed portion of the layer 140 in the first device region 120A.

With respect to the formation of the second dielectric layer 140, substantially the same criteria apply as previously explained with respect to the layer 130. Hence, during the deposition of the layer 140, respective process parameters may be adjusted in an appropriate manner so that a desired high intrinsic stress may be obtained.

FIG. 1d schematically illustrates the device 100 at a further advanced manufacturing stage, wherein a corresponding interlayer dielectric material 150, for instance comprised of silicon dioxide, may be formed above the first and second dielectric layers 130, 140. The dielectric material 150 may be formed on the basis of well-established techniques, such as sub-atmospheric deposition processes on the basis of TEOS, plasma assisted chemical vapor deposition (CVD) and the like, which may be followed by respective planarization processes, if required. Thereafter, respective contact openings may be formed, which may, in some cases, for instance in dense SRAM regions, connect to the device layer at areas located between respective closely spaced transistors and which may also extend into the isolation region 103. Thus, the corresponding voids 132 may affect the corresponding process, thereby resulting in less reliable contacts or even total contact failures, which may represent a major contribution to the overall yield losses during the fabrication of devices of the 45 nm technology.

As a consequence, upon further device scaling, the respective limitation of deposition processes for dielectric materials of high intrinsic stress may require a significant reduction of the layer thickness of the stress-inducing layers to comply with increased aspect ratios encountered in advanced device geometries. However, in this case, the respective strain induced by the stressed dielectric materials may also be significantly reduced, thereby also reducing transistor performance.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein addresses the problem of increased yield losses during the fabrication of highly scaled transistor elements caused by non-uniformities during the patterning of a contact structure on the basis of a dual stress liner approach, which is to be understood as a strain-inducing mechanism in which stressed dielectric layers are provided in the contact level of the semiconductor device to enhance performance of the corresponding transistor elements. Contrary to conventional dual stress liner approaches, according to the present disclosure, a technique and respective semiconductor devices are provided in which the surface topography may be enhanced or de-escalated after the deposition of a first stress-inducing dielectric material and also after the partial removal thereof and a subsequent deposition of a further stress-inducing layer and the partial removal thereof. In some illustrative aspects disclosed herein, this may be accomplished by providing the stress-inducing layers without any etch stop or etch control liners and by appropriately adapting the etch process parameters during the etch process for removing unwanted portions of the second stress-inducing dielectric layer, thereby also preparing the surface topography for an additional deposition of a further stress-inducing material. Consequently, by avoiding the deposition of any etch stop or etch control materials, an increased amount of the actual stress-inducing materials may be deposited for a given surface topography, wherein the corresponding etch processes for removing unwanted portions of the previously deposited stress-inducing materials may additionally be used for enhancing and thus de-escalating the surface topography so as to enable the deposition of a moderately high amount of a further stress-inducing material, which may subsequently be relaxed above certain device regions or which may be removed, depending on the overall process requirements. In some illustrative aspects disclosed herein, the present disclosure may be applied to densely packed device regions, such as static RAM regions, in which a significant degree of topography de-escalation, in particular above corresponding field regions, may contribute to enhanced reliability during the patterning of corresponding contact elements, which may connect to gate electrodes or conductive lines above the field regions and also connect to the active regions of the corresponding transistor elements. Consequently, the performance enhancing effect of stress-inducing dielectric materials may also be efficiently applied to semiconductor devices including transistor elements having critical dimensions of 40 nm and less without contributing to significant yield losses caused by deposition and patterning related irregularities, as is typically observed in conventional dual stress liner regimes.

One illustrative method disclosed herein comprises forming a first stress-inducing layer above first and second conductive lines formed in a device level of a semiconductor device. The method further comprises performing an etch process for removing the first stress-inducing layer from above the second conductive lines while maintaining the first stress-inducing layer above the first conductive lines. Additionally, the method comprises forming a second stress-inducing layer on the second conductive lines and on the first stress-inducing layer that is maintained above the first conductive lines. Moreover, the second stress-inducing layer and material of the first stress-inducing layer are selectively removed from above the first conductive lines. Finally, the method comprises forming at least one further stress-inducing layer above the first and second conductive lines, wherein the at least one further stress-inducing layer and the first stress-inducing layer induce the same type of stress.

A further illustrative method disclosed herein comprises forming a first stress-inducing layer above a first transistor and a second transistor that are located in a speed-critical device region. Moreover, the first stress-inducing layer is formed above a first transistor and a second transistor that are located in a second device region, wherein the first and second transistors of the speed-critical device region are of opposite conductivity type. Furthermore, the method comprises selectively removing the first stress-inducing layer from above the second transistor of the speed-critical device region and from at least one of the first and second transistors of the second device region. Moreover, a second stress-inducing layer is formed above the second device region and above the second transistor of the speed-critical device region and is also formed on the first stress-inducing layer formed above the first transistor of the speed-critical device region, wherein the second stress-inducing layer has a different type of internal stress compared to the first stress-inducing layer. Additionally, the method comprises removing the second stress-inducing layer from the first stress-inducing layer and at least one of the first and second transistors of the second device region. Finally, the method comprises forming a third stress-inducing layer above the second device region and the first and second transistors of the speed-critical device region, wherein the third stress-inducing layer and the first stress-inducing layer have the same type of internal stress.

One illustrative semiconductor device disclosed herein comprises a first device region comprising a first N-channel transistor and a first P-channel transistor. Moreover, a second device region is provided and comprises a second N-channel transistor and a second P-channel transistor. Additionally, the semiconductor device comprises a first stress-inducing layer formed on the first P-channel transistor and a second stress-inducing layer formed on the first N-channel transistor. Furthermore, a third stress-inducing layer is formed on the first stress-inducing layer and on the second N-channel transistor and P-channel transistor of the second device region.

BRIEF DESCRIPTION OF THE DRAWINGS

The disclosure may be understood by reference to the following description taken in conjunction with the accompanying drawings, in which like reference numerals identify like elements, and in which.

Figure 1A:
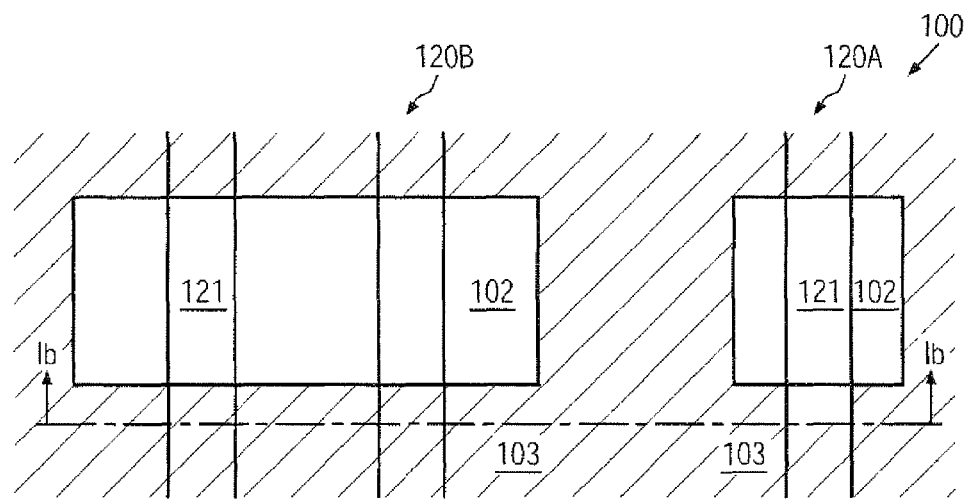
FIG. 1a schematically illustrates a top view of a semiconductor device including densely spaced transistor elements, according to a conventional circuit configuration.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides methods and semiconductor devices in which the basic concept of a dual stress liner approach may still be applied to sophisticated device geometries, for instance, including densely packed device regions with critical dimensions in the transistor level of approximately 40 nm and less, while reducing the creation of deposition and patterning related irregularities, such as voids, in particular provided above field regions having formed thereon closely spaced conductive lines or gate electrodes. To this end, in some illustrative embodiments, the first stress-inducing dielectric material may be deposited without any etch stop or etch control materials, thereby enabling the deposition of an increased amount of highly stressed dielectric materials while also providing the possibility of de-escalating the surface topography during the subsequent etch process for removing the first stress-inducing material from unwanted device portions. Thereafter, a second stress-inducing material having a different type of internal stress compared to the first stress-inducing material may be deposited directly on the device and on the previously maintained portion of the first stress-inducing material, wherein the previously de-escalated surface topography provides enhanced deposition conditions, thereby also reducing the probability of creating deposition-related irregularities. In a subsequent etch process, the second stress-inducing material may be removed selectively from above the first stress-inducing material, wherein, however, contrary to conventional approaches, the etch process may also result in a removal of a portion of the first stress-inducing material, thereby also providing a de-escalating effect of the etch process. On the other hand, a certain amount of the first stress-inducing material may be reliably maintained, for instance due to a different etch rate compared to the second dielectric material, thereby providing reliable protection of an underlying material, such as a silicon/germanium alloy, if sophisticated P-channel transistors are considered. At the same time, the etch process may result in an enhanced surface topography, in particular above field regions of the semiconductor device, thereby also providing enhanced deposition conditions for a further deposition process that is designed to provide a further stress-inducing material, which may have the same internal stress as the first stress-inducing material. Consequently, a desired high degree of strain may be induced by the first stress-inducing material, which may be removed to a certain degree during the previous etch process and by the additional stress-inducing material, which may be deposited with a moderately high thickness due to the enhanced surface topography. Thereafter, the internal stress level of the further stress-inducing material may be selectively relaxed, if desired, or, in other cases, unwanted portions of the further stress-inducing material may be removed. Consequently, enhanced surface conditions may be provided after the deposition of the first stress-inducing material due to the de-escalating effect of the subsequent etch procedures, wherein a certain degree of material removal or even a complete material removal of the first stress-inducing material during the patterning of the second stress-inducing material may be compensated for by a further stress-inducing material, which may be provided on the basis of significantly enhanced surface conditions. Furthermore, generally, an increased amount of stress-inducing material may be provided due to the possibility of omitting any etch stop or control materials.

In some illustrative embodiments, the above-described process technique may be combined with a locally selective application of the dual stress liner approach wherein only one single stress-inducing layer may be provided above certain device regions, such as static RAM regions and the like. In this case, the de-escalating effect of the corresponding etch processes for removing unwanted stress-inducing materials in other device regions may be applied twice, thereby enhancing the surface topography in densely packed device regions, wherein a desired single stress-inducing material may then be applied so as to comply with the requirements for the densely packed device regions, while, in other device areas, the previously described combined strain-inducing mechanism may be maintained. That is, in the densely packed device regions, such as the static RAM regions, the first and second stress-inducing materials may be substantially completely removed, thereby resulting in a significant topography de-escalation in each of the corresponding etch processes so that, in a subsequent deposition step, the final stress-inducing material may be applied substantially without deposition-related irregularities due to the enhanced surface conditions.

With reference to FIGS. 2a-2m, further illustrative embodiments will now be described in more detail, wherein reference may also be made to FIGS. 1a-1d, if appropriate.

Figure 2A:
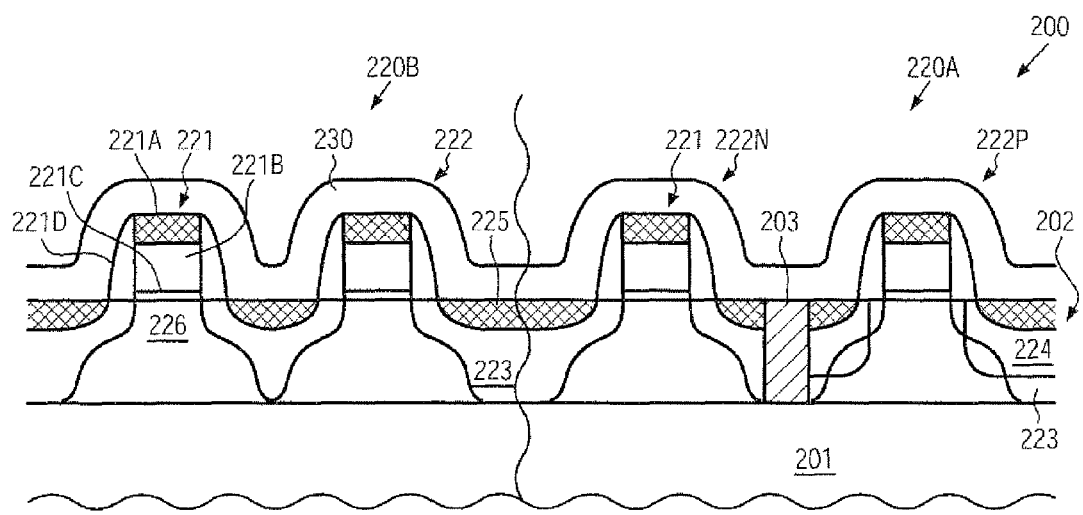
FIG. 2a schematically illustrates a cross-sectional view of a semiconductor device including a first device region, such as a densely packed device region, for instance in the form of a static RAM region, and a speed-critical device region, wherein transistor elements receive a first stress-inducing layer, according to illustrative embodiments.

FIG. 2a schematically illustrates a cross-sectional view of a semiconductor device 200 which may comprise a substrate 201 above which is formed a semiconductor layer 202, as is also similarly explained with reference to the semiconductor layer 102 of the device 100 as shown in FIG. 1a. Furthermore, the semiconductor device 200 may comprise a first device region 220A, which may represent a speed-critical device region in the sense that a plurality of transistors 222P, 222N may be provided therein, which may be included in a speed-critical signal path that may determine the overall operating speed of the semiconductor device 200. For instance, the transistors 222P and 222N, representing a P-channel transistor and an N-channel transistor, respectively, may be formed in and above a corresponding portion of the semiconductor layer 202, which also includes a corresponding isolation structure 203 for defining appropriate active regions for the transistors 222P, 222N. Furthermore, the semiconductor device 200 may comprise a second device region 220B which may represent a densely packed device region, wherein corresponding transistors 222 may be spaced with a minimum distance of approximately 100 nm and significantly less, as is also previously discussed with reference to the device 100. For instance, the transistors 222 may represent P-channel transistors, N-channel transistors or P-channel transistor and N-channel transistors, depending on the overall device configuration. The transistors 222P, 222N and the transistors 222 may have a different configuration, for instance with respect to transistor length and/or transistor width, wherein, for convenience, any such differences are not shown in FIG. 2a. For example, in device regions including non-speed-critical transistor elements, such as the region 220B, the transistor length and/or the transistor width may be increased compared to high performance transistor elements, such as the transistors 222P, 222N, thereby reducing overall power consumption of the non-critical device regions. If an increased transistor length may be required in the region 220B, the length of the corresponding gate electrodes 221, i.e., in FIG. 2a, the horizontal dimension of the gate electrodes 221, may be increased compared to the speed-critical transistors in the device region 220A. In this case, the overall topography of the device region 220B may be even further complicated since a high packing density, i.e., a high number of transistor elements per unit area, may nevertheless be required in the device region 220B. Irrespective of any differences in transistor configuration, in the following, the components of the transistor elements in the device regions 220A, 220B may commonly be indicated by the same reference numerals and may also be illustrated in a substantially identical manner, wherein, however, it should be appreciated that corresponding differences, for instance with respect to the conductivity type, transistor dimensions and the like, may exist.

The transistors 222P, 222N, 222 may comprise a gate insulation layer 221C, a gate electrode material 221B and a highly conductive metal-containing material 221A, for instance in the form of a metal silicide, if the gate electrode structures 221 are provided in the form of a silicon-based material. Furthermore, the gate electrode structures 221 may comprise a spacer structure 221D which may have a more or less complex configuration, depending on the previous process regime. Moreover, corresponding drain and source regions 223 may laterally enclose corresponding channel regions 226, the conductivity of which may be enhanced by providing a desired type of strain therein. Furthermore, metal silicide regions 225 may be formed in the drain and source regions 223. In some illustrative embodiments, some of the transistors in the first and second device regions 220A, 220B may have incorporated therein additional strain-inducing mechanisms, such as an embedded semiconductor alloy 224, which may be incorporated in a strained state, thereby also inducing a desired type of strain in the adjacent channel region 226. In the embodiment shown, the transistor 222P may have incorporated therein the semiconductor alloy 224, which may result in a compressive strain if the transistor 222P represents a P-channel transistor. For instance, silicon/germanium, silicon/germanium/tin, silicon/tin and the like are appropriate semiconductor alloys for obtaining a desired compressive strain. In other cases, a silicon/carbon alloy may be used for inducing a tensile strain component. It should be appreciated that the transistor 222N may also have incorporated therein a strained semiconductor material which may be created by stress memorization techniques during the previous processing and/or by incorporating an appropriate semiconductor alloy, such as silicon/carbon, if the transistor 222N represents an N-channel transistor. It should be appreciated that a stress memorization technique is to be understood as a procedure in which a semiconductor material may be substantially amorphized to a certain depth and may then be re-crystallized in the presence of a cap layer, which may result in a strained re-crystallization of the amorphized semiconductor portion. This strained state may be preserved, at least partially, even after removal of the corresponding cap layer.

It should be appreciated that the transistors 222 in the second device region 220B may also comprise one or more additional strain-inducing mechanisms, if required. For convenience, any such mechanisms are not illustrated in FIG. 2a.

Figure 1B:
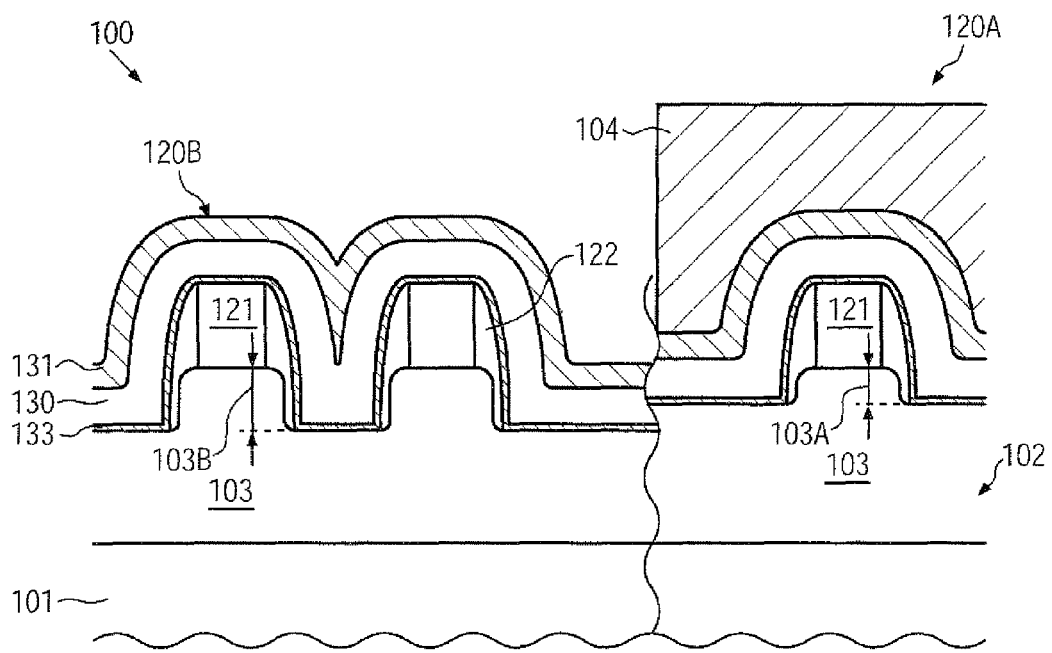
FIGS. 1b-1d schematically illustrate cross-sectional views of the conventional semiconductor device during various manufacturing stages in forming differently stressed dielectric layers on the basis of a conventional dual stress liner approach including etch stop materials and etch control materials, resulting in deposition and/or patterning related irregularities, in particular in device regions of pronounced surface topography.
Figure 1C:
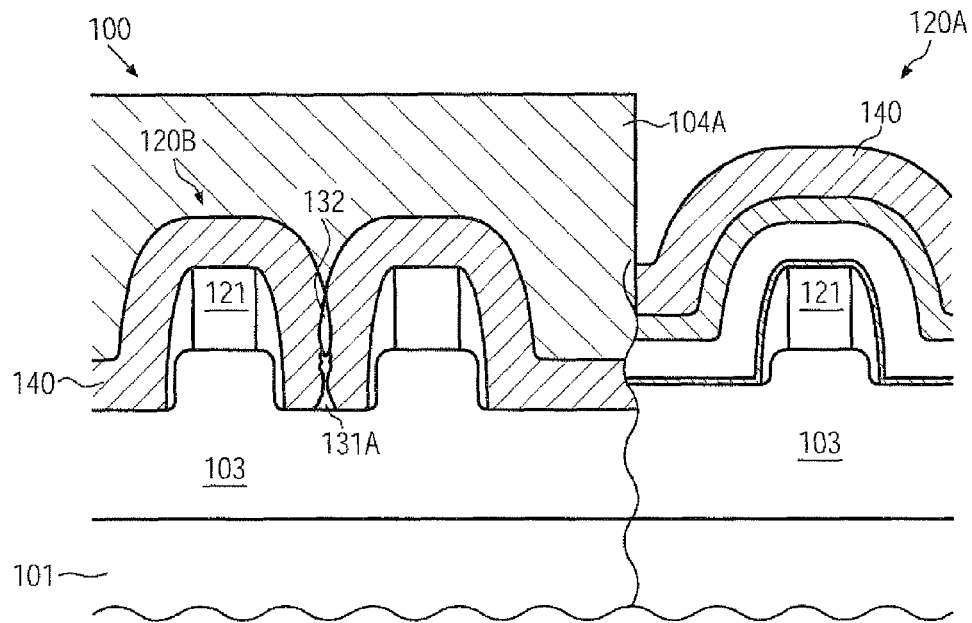
Figure 1D:
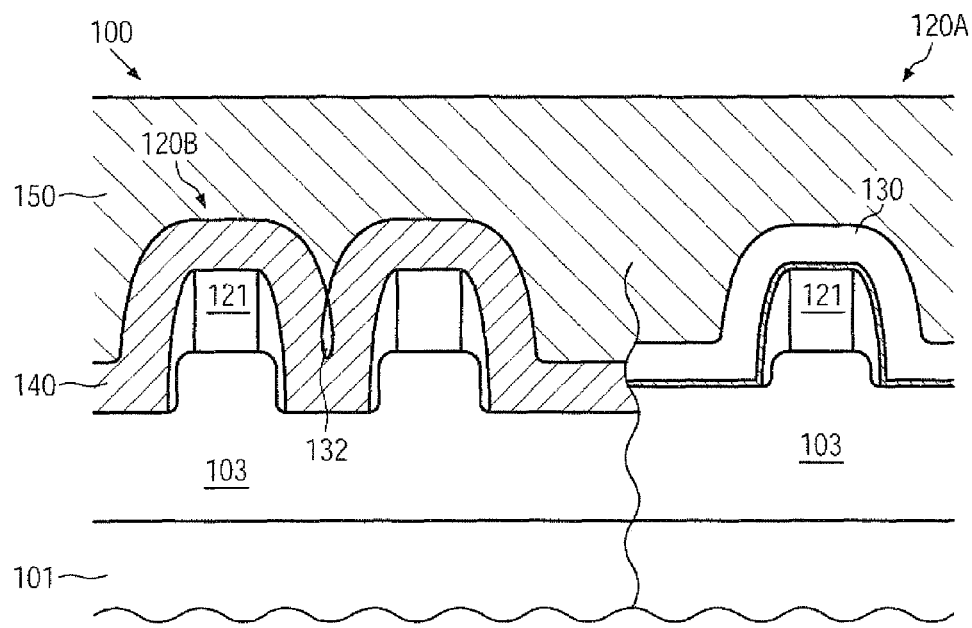

Furthermore, in the manufacturing stage shown, a first stress-inducing material layer 230 is formed above the first and second device regions 220A, 220B, wherein, contrary to conventional techniques, the stress-inducing layer 230 may be provided without an etch control layer formed thereabove, such as the layer 131 (FIG. 1b). In one illustrative embodiment, the first stress-inducing layer 230 may be formed directly on the corresponding transistor elements without any intermediate etch stop material, such as the etch stop layer 133 (FIG. 1b). That is, the stress-inducing dielectric material 230 may be formed directly on the corresponding metal silicide regions 221A, 22T, thereby providing a highly efficient stress transfer mechanism since any intermediate "buffer materials" such as an etch stop liner may be omitted. Thus, the thickness of the layer 230 may be increased compared to a stress-inducing material of a conventional device in which, for a given device geometry, etch stop and etch control materials may also have to be provided. In one illustrative embodiment, the stress-inducing layer 230 may be provided with an internal compressive stress level which may be selected so as to enhance performance of the transistor 222P. For instance, the stress-inducing layer 230 may be comprised of silicon nitride, nitrogen-containing silicon nitride, diamond-like carbon and the like, since these materials may be deposited with a high internal compressive stress level on the basis of well-established plasma enhanced CVD techniques. In other illustrative embodiments, the stress-inducing layer 230 may be provided with an internal tensile stress level if, for instance, performance of an N-channel transistor is to be enhanced. For example, silicon nitride may be formed with a high internal tensile stress level, as is also previously explained.

Figure 2B:
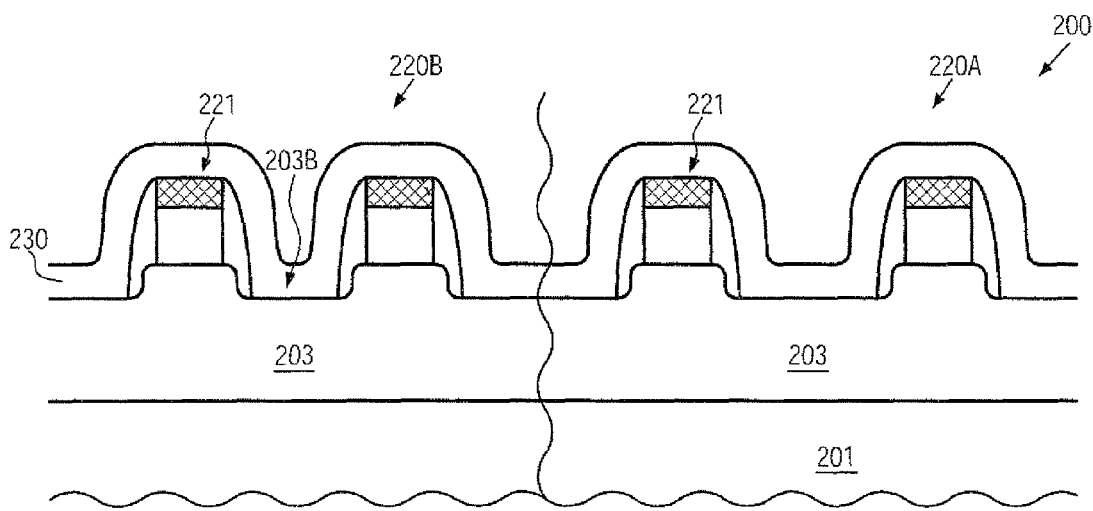
FIG. 2b schematically illustrates a cross-sectional view of the device of FIG. 2a wherein a section is illustrated through a field region in which a pronounced surface topography may be encountered.

FIG. 2b schematically illustrates a cross-sectional view of the semiconductor device 200 taken outside of corresponding active regions of the first and second device regions 220A, 220B, similarly to a cross-sectional view as explained with reference to FIGS. 1a and 1b. Thus, as illustrated, the gate electrode structures 221, which may now be considered as conductive lines, may extend above the isolation structure 203, wherein also corresponding recesses 203B may result in an even more pronounced surface topography, in particular in the densely packed device region 220B, as is also previously explained with reference to the semiconductor device 100. However, since the stress inducing-layer 230 may be provided without at least an etch control layer formed thereabove, a less critical geometry may be accomplished after the deposition of the material 230, although material may be provided with increased thickness compared to conventional dual stress liner approaches for a given overall device geometry.

The semiconductor device 200 as shown in FIGS. 2a and 2b may be formed on the basis of the following processes. The basic transistor configurations in the first and second device regions 220A, 220B may be produced on the basis of well-established process techniques, as are also described with reference to the device 100. After forming the metal silicide regions 225 and 221, the first stress-inducing layer 230 may be deposited by using well-established deposition recipes and material compositions, as specified above, wherein a thickness may be selected in accordance with the overall device geometry. For example, for semiconductor devices including transistor elements of the 45 nm technology and beyond, for instance the 32 nm technology, a thickness of approximately 40 nm may be selected, which may thus provide a highly efficient strain-inducing effect, wherein, also, if any etch stop material may not be provided between the basic transistor elements and the stress-inducing layer 230, an even further enhanced overall strain-inducing effect may be accomplished.

Figure 2C:
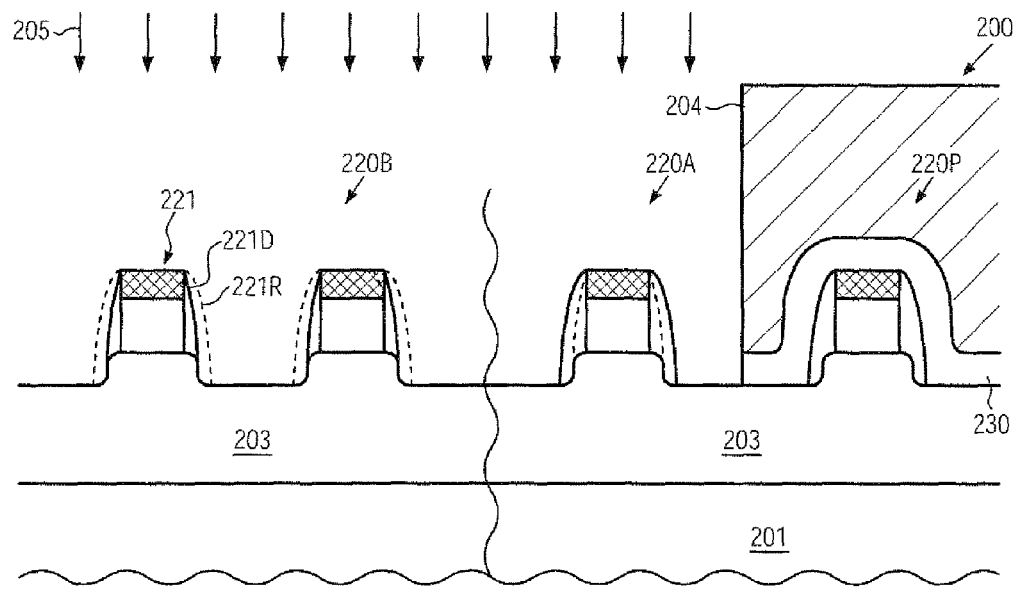
FIG. 2c schematically illustrates a cross-sectional view through the field region in a further advanced manufacturing stage after a first de-escalation of the surface topography, according to illustrative embodiments.

FIG. 2c schematically illustrates a cross-sectional view of the semiconductor device 200 outside of corresponding active regions, similar to the section of FIG. 2b, in a further advanced manufacturing stage. As illustrated, an etch mask 204 is formed so as to expose specific portions of the device 200 to an etch ambient 205 that is appropriately designed for removing exposed portions of the first stress-inducing layer 230. In the embodiment shown, the mask 204 may cover the transistor 220P for which the strain-inducing effect of the layer 230 may be considered advantageous in view of enhancing transistor performance, as previously explained. For example, the transistor 220P may represent a P-channel transistor and the layer 230 may have a desired high internal compressive stress level. The etch process 205 may be performed on the basis of well-established etch recipes available in the art for silicon nitride material, nitrogen-containing silicon carbide material, carbon material and the like. In the embodiment shown, a corresponding "de-escalation" of the surface topography may also be accomplished during the process 205 due to the missing etch stop liner, thereby reducing complexity of the overall patterning regime compared to conventional dual stress liner approaches. That is, during the removal of unwanted portions of the layer 230, the resulting surface topography may also be de-escalated in a final phase of the etch process 205, for instance by removing material of the spacer structures 221D and rounding corresponding corners of the recesses 203B and the like. Consequently, after the etch process 205, an enhanced surface topography may be provided in exposed areas of the device 200, while the material 230 may be maintained above the transistor 220P.

Figure 2D:
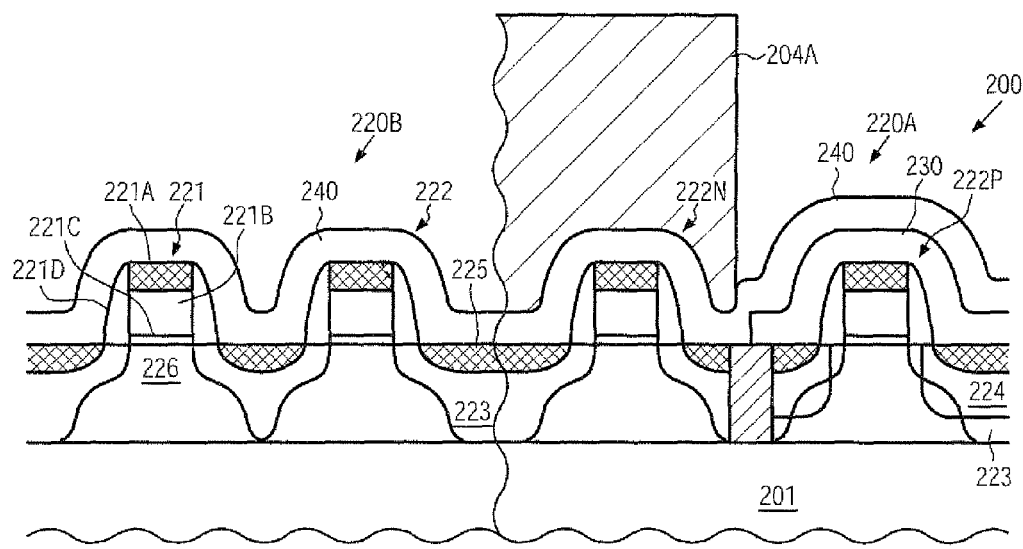
FIGS. 2d-2e schematically illustrate cross-sectional views of active regions in further advanced manufacturing stages wherein a further topography de-escalation may be performed, according to illustrative embodiments.

FIG. 2d schematically illustrates a cross-sectional view through the corresponding active regions of the device 200, similar to the cross-section of FIG. 2a, in a further advanced manufacturing stage. As illustrated, the device 200 may comprise a second stress-inducing layer 240 having an internal stress level that is opposite to the stress level of the layer 230 which is still formed above the transistor 222P. Thus, the second stress-inducing material 240 may have an internal stress component that is designed for enhancing performance of the transistor 222N. As illustrated, the second stress-inducing material 240 may be formed on the first stress-inducing layer 230, i.e., without any intermediate etch control or etch stop material. Furthermore, due to the previous etch process 205, the material 230 may be substantially completely removed from the transistor 222N so that the second stress-inducing layer 240 may also be formed directly on this transistor, thereby providing an enhanced strain transfer mechanism. Furthermore, due to the previous de-escalating effect of the etch process 205, a corresponding reduction of the spacer structure 221D may also contribute to enhanced deposition conditions and a superior strain transfer mechanism. Furthermore, an etch mask 204A may be provided so as to cover any device portions in which a removal of the second stress-inducing material 240 is not desired. In the embodiment shown, the mask 204A may also expose the transistors 222 in the second device region 220B, if only one single stress-inducing material is to be provided in the device region 220B, which may be accomplished in a later manufacturing stage. In other illustrative embodiments, also in the second device region 220B, the mask 204A may cover respective transistors while exposing other transistors, as is illustrated for the device region 220A.

The semiconductor device 200 as illustrated in FIG. 2d may be formed on the basis of well-established deposition techniques for depositing the material 240 having the desired internal stress level. Due to the previously prepared surface, the corresponding deposition may be accomplished substantially without deposition-related irregularities or at least with a significantly reduced degree of void formation. Thereafter, the etch mask 204A may be provided on the basis of well-established lithography techniques.

Figure 2E:
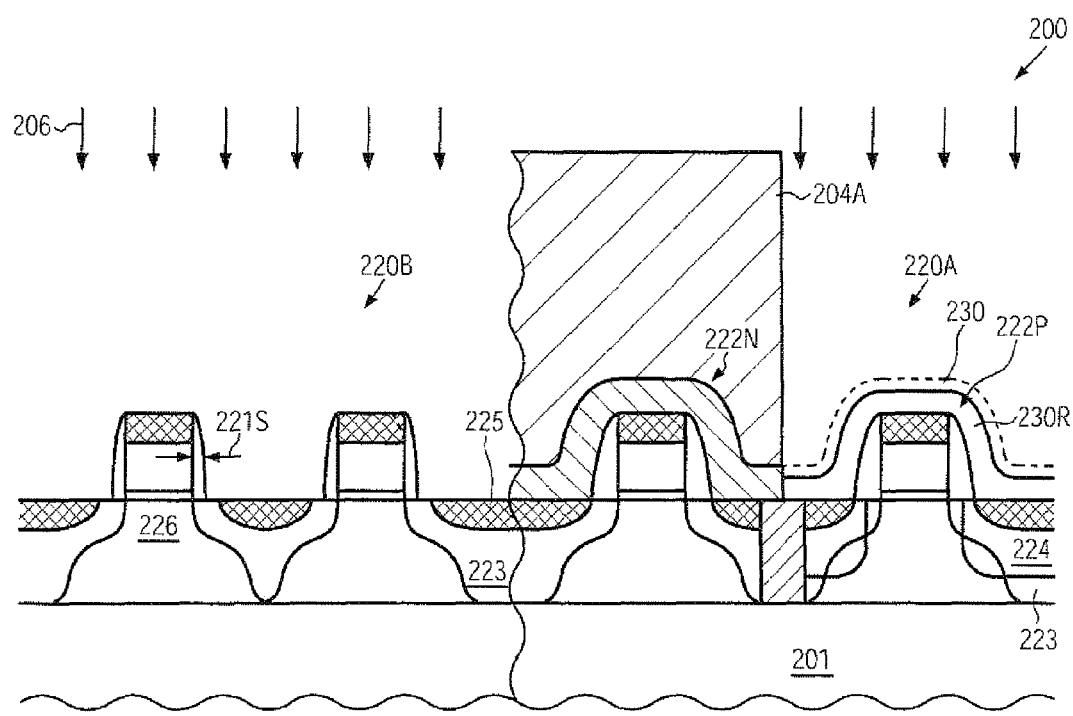

FIG. 2e schematically illustrates the semiconductor device 200 during a further etch process 206 which may be performed on the basis of an etch chemistry designed to efficiently remove material of the layer 240 (FIG. 2d) while not requiring a pronounced selectivity with respect to the material 230. For instance, a plurality of etch chemistries are available for etching silicon nitride material which may be used during the process 206. As illustrated, the etch process 206 may remove unwanted portions of the material 240 and may also remove material of the layer 230 to a certain degree, thereby obtaining a layer of reduced thickness 230R above the transistor 222P. It should be appreciated that the etch chemistry 206 may be readily adjusted so as to have a higher etch rate for the material of the layer 240 compared to the layer 230 due to the different material compositions of these layers, even if the same basic material composition may be used, such as silicon nitride. That is, typically, the tensile stressed dielectric material of the layer 240 may have a higher etch rate compared to the compressively stressed material of the layer 230. Consequently, the material 240 may be reliably removed from above the transistor 222P without substantially completely removing the material of the layer 230. Hence, the residual layer 230R may reliably protect the transistor 222P, for instance the strained semiconductor alloy 224, if provided, while nevertheless the removal of the material 230 may additionally provide enhanced surface conditions for a subsequent deposition of a further stress-inducing material. Thus, the etch process 206 may be performed on the basis of a single etch chemistry, thereby enabling a reliable removal of unwanted portions of the layer 240 while also providing a desired de-escalation of the resulting surface topography. For instance, in the second device region 220B, the material 240 may be removed and a further de-escalation, i.e., a further reduction of a spacer structure, indicated as 221S, may be accomplished and a further corner rounding may be created in the field region (see FIG. 2c) and may be obtained in the second device region 220B.

Figure 2F:
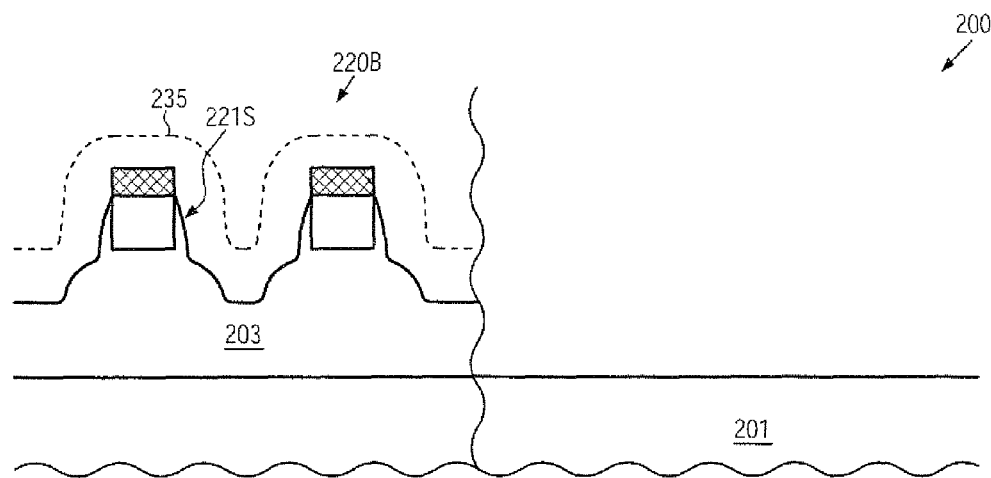
FIG. 2f schematically illustrates a cross-sectional view of the field region after enhanced topography de-escalation, according to illustrative embodiments.

FIG. 2f schematically illustrates a cross-sectional view of the second device region 220B with the de-escalated topography, including the further reduced spacer structure 221S. Consequently, the resulting surface topography in the region 220B may enable the deposition of a further stress-inducing material, indicated by the dashed line 235, with a moderately high thickness of, for instance, approximately 40 nm and higher, without contributing to deposition-related irregularities, such as voids, which may contribute to contact failures in the region 220B, as is also previously discussed with reference to the device 100.

Figure 2G:
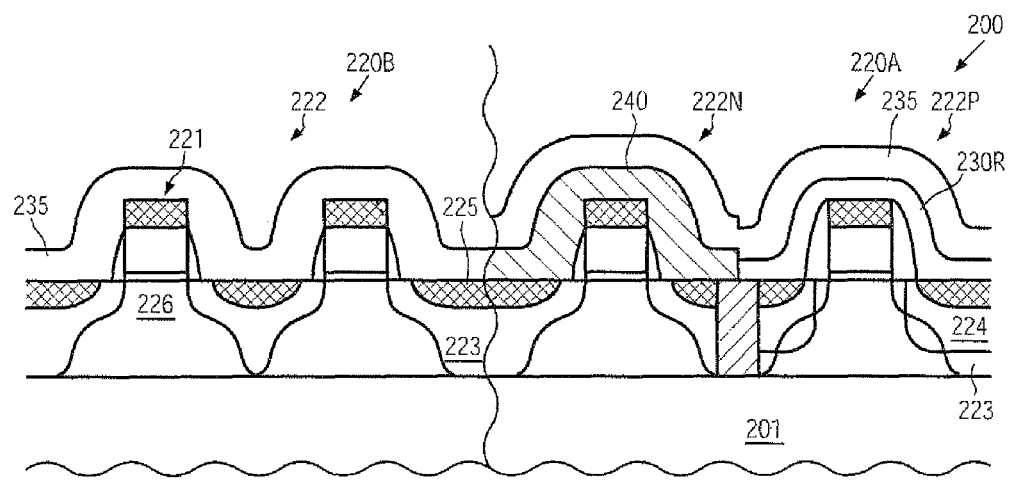
FIGS. 2g-2h schematically illustrate cross-sectional views of active areas of the semiconductor device in further advanced manufacturing stages for forming at least one further stress-inducing layer and locally relaxing the same, according to illustrative embodiments.

FIG. 2g schematically illustrates the semiconductor device 200 in a cross-sectional view along corresponding active regions after the deposition of the further stress-inducing material 235. Hence, the stress-inducing layer 235 is formed on the transistors 222 in the device region 220B and is formed on the layer 240 above the transistor 222N and on the layer 230R above the transistor 222P. In the embodiment shown, the material 235 may be formed with the same type of internal stress level as the layer 230R, thereby achieving a desired high strain-inducing effect in the transistor 222P. Furthermore, the material 235 may have a performance enhancing effect on at least some of the transistors 222 in the second device region 220B. As discussed above, the layer 235 may be deposited on the basis of a less critical surface topography due to the previous de-escalation, wherein a corresponding thickness of the layer 235 may be adapted to the surface geometry in the second device region 220B, which may typically include the closely spaced transistors 222. Thus, the material 235 may be provided with a comparable thickness with respect to the layer 240, while in other cases, when a very sophisticated device geometry in the second region 220B may require a reduced thickness of the material 235 in order to obtain a substantially void-free deposition, nevertheless, the combined thickness of the layers 230R and 235 may provide a highly efficient overall strain-inducing mechanism for the transistor 222P. In this case, the material 235 may be selected to be less than the thickness of the layer 240 and the thickness of the initially deposited layer 230 (FIG. 2a).

In other illustrative embodiments (not shown), the layer 235 may include a buffer material (not shown) which may be deposited first and which may be provided on the basis of a deposition technique providing enhanced gap fill capabilities compared to a plasma enhanced deposition technique for depositing a highly stressed dielectric material.

As a result, strain-inducing mechanisms may be provided in a highly efficient manner for the transistors 222P and 222N since, in total, an increased amount of stress-inducing material may be provided due to the avoidance of etch control materials in the preceding patterning regime, while, at the same time, enhanced surface conditions may be achieved in the second device region 220B, including the densely packed transistors 222. Thus, the material 235, which may enhance performance of at least one type of the transistors 222, may be provided substantially without deposition and patterning related irregularities so that corresponding contacts, which may connect the gate electrode 221 with respective active regions of the transistors 222, as previously explained with reference to the device 100, may be formed with enhanced reliability, thereby reducing yield losses in an advanced manufacturing stage. Furthermore, compared to conventional strategies in which standard dual stress liner approaches may be used in combination with a spacer removal after the silicide formation, a corresponding degradation of transistors including sophisticated semiconductor alloys, such as the alloy 224, may be avoided while nevertheless providing the desired enhanced surface topography. In other conventional strategies, very sophisticated deposition-etch-deposition cycles may be used for forming a highly stressed dielectric material above sophisticated surface topographies which may involve extremely complicated process sequences. According to the principles disclosed herein, a reduced probability of creating contact failures while still maintaining a very efficient strain-inducing mechanism may be accomplished by the enhanced topography escalation and by providing the additional stress-inducing layer 235. Hence, even a reduced process complexity compared to conventional dual stress liner approaches may be accomplished since the deposition of the additional stress-inducing material 235 may be over-compensated for by the omission of the deposition of respective etch stop and etch control materials, while also the corresponding etch processes for patterning the layers 230, 240 may be performed each with a single etch chemistry, thereby concurrently obtaining the desired de-escalation of the surface topography.

Figure 2H:
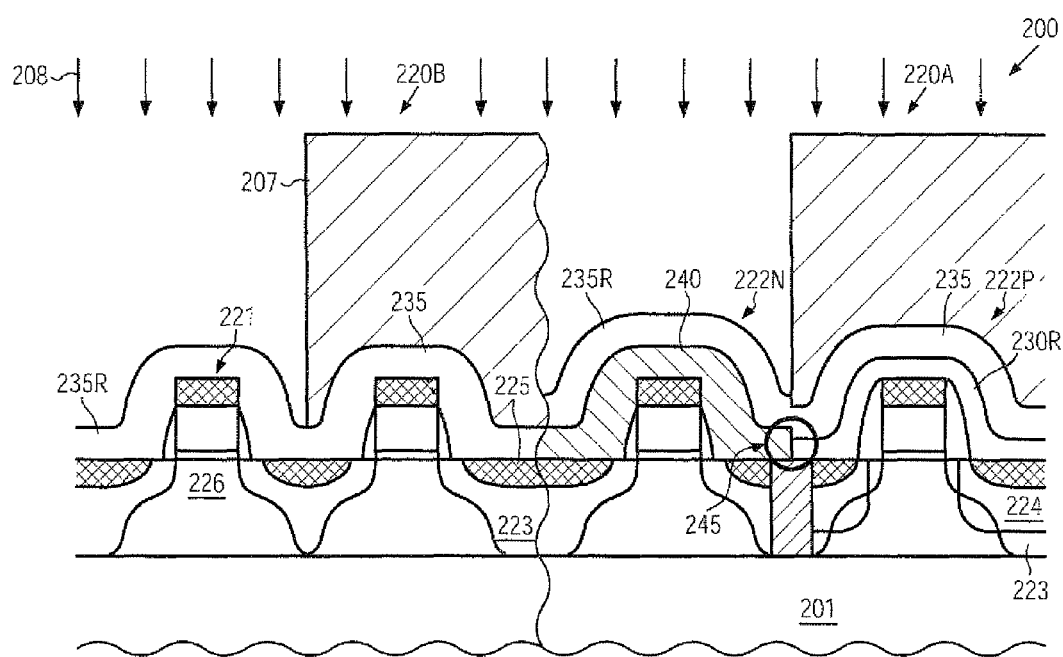

FIG. 2h schematically illustrates the semiconductor device 200 in a further advanced manufacturing stage in which the internal stress level of the layer 235 may be reduced or relaxed in certain device areas. For this purpose, a mask 207 may be provided, for instance in the form of a resist mask and the like, which may cover the transistor 222P, in which the stress level of the layer 235 is advantageous with respect to overall transistor performance, while the transistor 222N is exposed by the mask 207. Moreover, the device 200 may be exposed to an ion bombardment 208 which may be performed on the basis of an ion implantation process using appropriate implantation species, such as xenon, germanium, silicon and the like, which may result in a significant modification of the structure of exposed portions of the layer 235. During the ion bombardment 208, respective process parameters, such as ion energy, dose and the like, may be appropriately selected so as to substantially restrict the relaxing or stress reducing effect to the thickness of the layer 235, substantially without significantly affecting underlying materials, such as the layer 240 formed above the transistor 222N. Appropriate process parameters may be readily established by using simulation programs, performing test runs and the like. In the embodiment shown in FIG. 2h, the mask 207 may expose corresponding transistors in the second device region 220B, for which the internal stress level of the material layer 235 may be considered inappropriate. For instance, if the material 235 may initially be comprised of a compressively stressed material, the mask 207 may expose N-channel transistors in the device region 220B in order to provide a relaxed or stress reduced material 235R. As previously explained, in conventional approaches, frequently, a single material may be provided in densely packed device regions in view of reducing deposition and patterning related irregularities, wherein a corresponding selective relaxation of the internal stress level of the single material may be required. In this case, the ion bombardment 208 shown in FIG. 2h may not represent an additional process step compared to these conventional approaches, so that the efficient stress relaxation in the regions 220A, 220B may not add to process complexity wherein, however, enhanced efficiency and reliability may be obtained due to the preceding highly efficient de-escalation procedure.

Hence, after the ion bombardment 208 and the removal of the mask 207, the further processing may be continued on the basis of well-established process techniques, i.e., a corresponding interlayer dielectric material may be deposited and may be patterned to form a corresponding contact structure, as is also previously discussed with reference to the semiconductor device 100.

It should be appreciated that, in the embodiment shown in FIG. 2h, an overlap of the layers 240, 230 in a region 245 may not be required, as may be the case in conventional dual stress liner approaches, since a reliable coverage of the device 200 may be accomplished by the material layer 235. That is, typically, the material 235 may provide reliable confinement of the transistors 222P, 222N and 222 in the regions 220A, 220B with respect to any reactive metals, such as copper and the like, which may be used during the further processing of the device 200. In conventional dual stress liner approaches, however, any process fluctuations with respect to lithography processes for providing the respective etch masks for patterning the layers 230, 240 may have to be taken into consideration in order to reliably maintain a diffusion hindering layer at the region 245, thereby typically requiring a significant overlap, which may result in a highly complex patterning process upon forming contact openings that may extend into the region 245. That is, in the region 245, according to convention dual stress liner approaches, a pronounced topography of the overlapping layers of different stress level in combination with corresponding etch stop and etch control material may be encountered, which may result in corresponding irregularities and thus yield losses during the formation of contact elements extending into the region 245, unless complex and sophisticated countermeasures may have to be used. Contrary to this complex situation, process techniques described herein may not require a corresponding overlap in view of lithography variations since, even if a pronounced gap may be created between the layers 230 and 240, reliable confinement may nevertheless be accomplished on the basis of the material 235. Consequently, a further reduced degree of complexity may be accomplished on the basis of the process techniques described above.

With reference to FIGS. 2i-2m, further illustrative embodiments will now be described in which the first and second stress-inducing materials may also be maintained in the device region 220B, while nevertheless an enhanced overall surface topography may be accomplished.

Figure 2I:
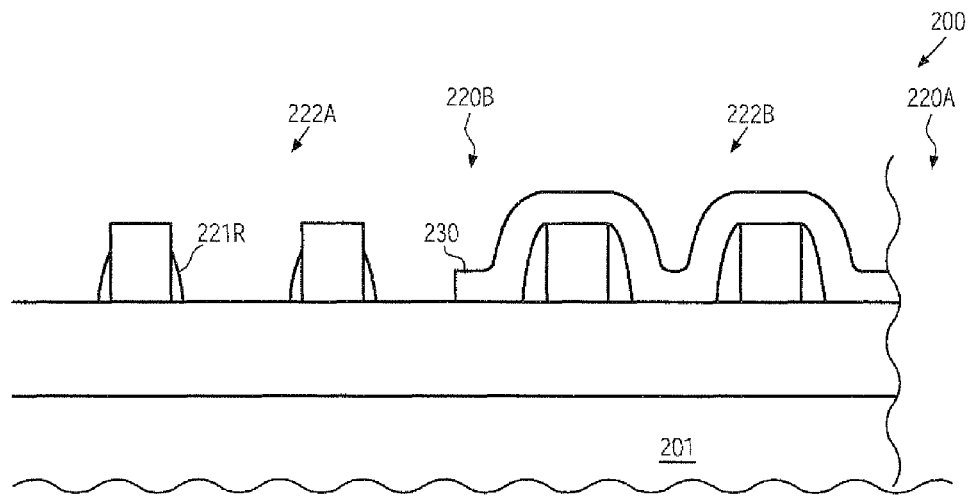
FIGS. 2i-2m schematically illustrate cross-sectional views of a densely packed device region during various manufacturing stages in which enhanced topography de-escalation may be provided in combination with the removal of unwanted layer portions of stress-inducing dielectric materials, according to still further illustrative embodiments.

FIG. 2i schematically illustrates the semiconductor device 200 in a manufacturing stage after depositing the first stress-inducing layer 230 and removing a portion thereof above certain transistors for which a presence of the material 230 is considered inappropriate. As illustrated, the layer 230 may be maintained above transistors 222B in the region 220B, while the layer 230 may be removed above transistors 222A, wherein a corresponding de-escalation of the surface topography, for instance a reduction of spacer width, as indicated by 221R, and the like, may also be achieved, as previously discussed.

Figure 2J:
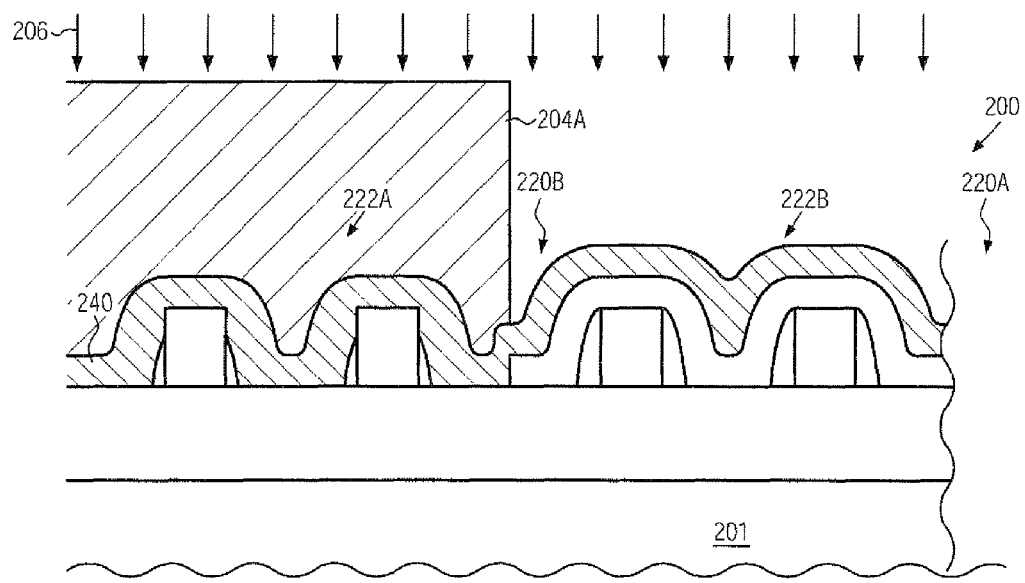

FIG. 2j schematically illustrates the device 200 wherein the second stress-inducing layer 240 is formed on the transistors 222A and on the layer 230 in the device region 220B. Also in this case, the layer 240 may be provided on the basis of an enhanced surface topography above the transistors 222A. Thereafter, the mask 204A may be formed to expose the transistors 222B to the etch process 206, during which the exposed portion of the layer 240 may be removed and a part of the layer 230 may also be reduced in order to de-escalate the surface topography above the transistors 222B.

Figure 2K:
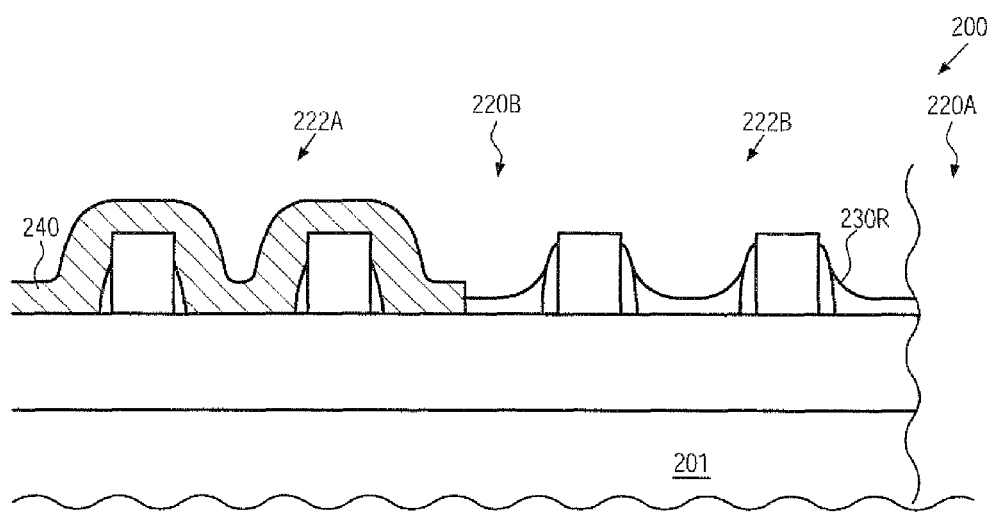

FIG. 2k schematically illustrates the semiconductor device 200 after the above-described process sequence and the removal of the etch mask 204A. As illustrated, the transistors 222B comprise the reduced material layer 230R, thereby also providing a de-escalated surface topography, while the layer 240 with the enhanced surface topography is still present above the transistors 222A.

Figure 2L:
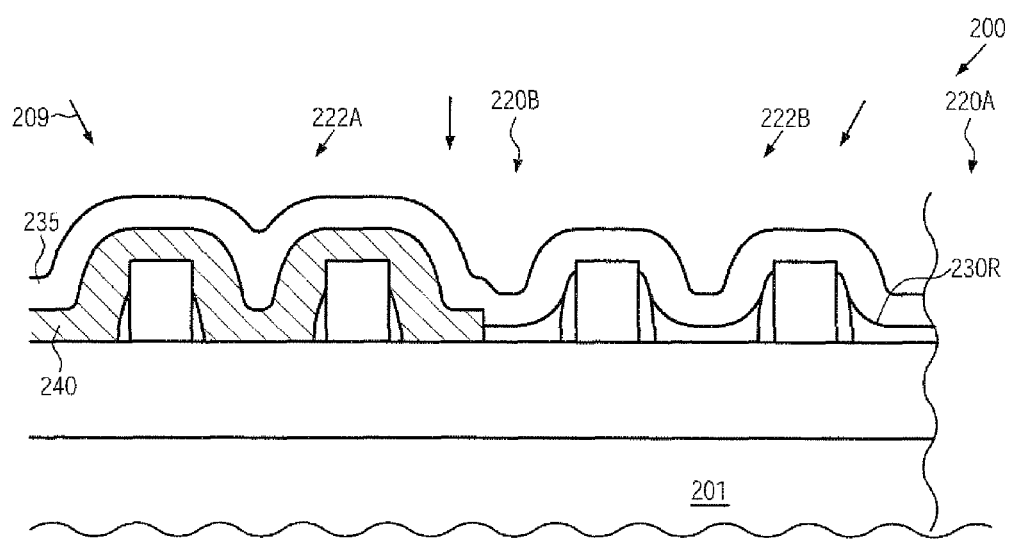

FIG. 2l schematically illustrates the device 200 during a deposition process 209 for forming the additional stress-inducing layer 235, which may thus be provided with an appropriate thickness substantially free of any voids due to the superior surface topography of the layers 240, 230R. Consequently, an overall high strain-inducing effect may be accomplished for the transistors 222B since the combined strain-inducing effect of the layers 230R and 235 may result in an efficient strain component, as is also previously explained.

Figure 2M:
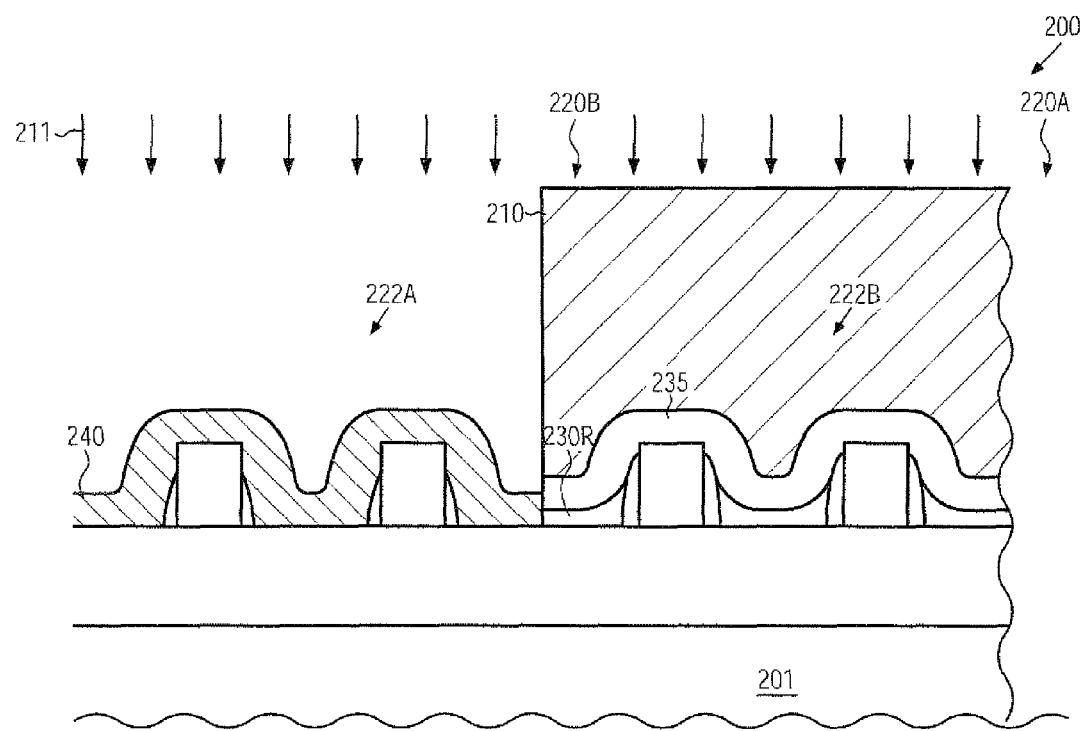

FIG. 2m schematically illustrates the device 200 in a further advanced manufacturing stage in which an unwanted portion of the layer 235 may be removed on the basis of a corresponding etch mask 210, which may expose transistors 222A to an etch ambient 211. It should be appreciated that the etch mask 210 may also expose corresponding transistors in the region 220A, above which the material 235 may also be removed, if considered inappropriate for the overall performance of the device 200. In some illustrative embodiments, the material 235 may be provided in the form of a layer stack including a thin buffer material in combination with the actual stress-inducing material, thereby providing enhanced controllability during the etch process 211 while not unduly affecting the overall strain induced in the transistors 222B. In other illustrative embodiments, the etch process 211 may be performed without any etch stop or etch control material, wherein a certain degree of material removal of the layer 240 may not be considered as inappropriate.

Consequently, after removing the etch mask 210, the further processing may be continued by depositing an appropriate interlayer dielectric material and patterning the same, wherein enhanced reliability in forming respective contact elements may also be accomplished.

As a result, the present disclosure provides techniques and semiconductor devices in which an efficient strain-inducing mechanism on the basis of a dual stress liner approach may be accomplished with a moderately high layer thickness, for instance approximately 40 nm and higher, even for sophisticated semiconductor devices corresponding to the 45 nm technology or the 32 nm technology and beyond. For this purpose, the sophisticated topography, for instance of closely spaced polysilicon lines positioned above field regions, may be de-escalated for both N-type devices and P-type devices by appropriate etch procedures that may be performed on the basis of a single etch chemistry for each patterning process. To this end, any etch stop or etch control materials may be omitted, thereby not only enhancing efficiency of the corresponding deposition regime for the stress-inducing materials but also providing the possibility of using increased thickness values for the stress-inducing materials. Moreover, the buffer effect of any etch stop materials may be avoided, thereby contributing to a more efficient strain-inducing mechanism.

Furthermore, as previously discussed, in some cases, it may be advantageous to increase the gate length of transistors, for instance in static RAM areas, in order to reduce overall power consumption of the memory areas. A corresponding increase of the gate length, and thus a reduction of the spacing between adjacent gate electrodes, may require, in conventional dual stress liner approaches, an appropriate adaptation of the layer thickness of the stress-inducing material, even if only a single stress-inducing material may be used in the static RAM region. The corresponding layer of reduced thickness used in conventional approaches, in view of the more sophisticated device geometry, may thus also have to be provided in performance-driven transistor elements in other device areas, thereby reducing the overall efficiency of the strain-inducing mechanism. According to the present disclosure, however, both stress-inducing layers may initially be removed from these sophisticated device areas, thereby also efficiently de-escalating the resulting surface topography. Furthermore, the initial stress-inducing material may be provided with a thickness that is adjusted such that material may be preserved above corresponding transistor active regions during the etch process for removing the second stress-inducing material, while at the same time de-escalating the surface topography above the corresponding field regions having the sophisticated topography. Thereafter, the further stress-inducing material may be provided with a thickness appropriate for complying with the sophisticated device geometry in the field regions of the densely packed device area, thereby resulting in a substantially void-free deposition behavior, while nevertheless, in the transistor active areas, the combination of the previously preserved material and the additional stress-inducing material may provide the desired enhancement of transistor performance. Thereafter, specific portions of the additional stress-inducing material may be relaxed or removed, depending on the overall process strategy. In some illustrative embodiments, the first and second stress-inducing materials may be provided without requiring a dedicated overlap area, since the additional stress-inducing material may provide reliable confinement of the transistor devices with respect to materials used during the further processing of the device.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first stress-inducing layer above first and second conductive lines formed in a first device region of a semiconductor device and above a second device region comprising a plurality of closely spaced transistor elements;
    performing an etch process for removing said first stress-inducing layer from above said second conductive lines and said plurality of closely spaced transistor elements while maintaining said first stress-inducing layer above said first conductive lines;
    forming a second stress-inducing layer on said second conductive lines, on said first stress-inducing layer that is maintained above said first conductive lines, and on said plurality of closely spaced transistor elements;
    selectively removing said second stress-inducing layer and material of said first stress-inducing layer from above said first conductive lines and selectively removing said second stress-inducing layer from above said plurality of closely spaced transistor elements; and
    forming at least one further stress-inducing layer above said first and second conductive lines and said plurality of closely spaced transistor elements, said at least one further stress-inducing layer and said first stress-inducing layer inducing the same type of stress.

2. The method of claim 1, wherein said first and second conductive lines have a line width of approximately 50 nm or less.

3. The method of claim 1, further comprising reducing a stress level of said at least one further stress-inducing layer above said second conductive lines by performing an ion bombardment.

4. The method of claim 1, further comprising removing said at least one further stress-inducing layer from above said second conductive lines.

5. The method of claim 1, wherein selectively removing said second stress-inducing layer and material of said first stress-inducing layer from above said first conductive lines comprises performing an etch process on the basis of a single etch chemistry.

6. The method of claim 1, wherein said device region represents a static RAM (random access memory) region.

7. The method of claim 1, wherein forming said at least one further stress-inducing layer comprises depositing a buffer layer and a third stress-inducing layer on said buffer layer.

8. The method of claim 1, wherein said first stress-inducing layer is formed with an internal compressive stress level and said second stress-inducing layer is formed with an internal tensile stress level.

9. The method of claim 1, wherein one of said first and second stress-inducing layers is formed so as to have an internal compressive stress level and wherein said internal compressive stress level is created by a material composition comprising at least one of silicon nitride, nitrogen-containing silicon carbide and diamond-like carbon.

10. The method of claim 6, wherein a thickness of said at least one further stress-inducing layer is less than a thickness of said first stress-inducing layer and said second stress-inducing layer.

11. The method of claim 1, wherein said first and second stress-inducing layers are formed without an overlap at an area located laterally between a first one of said first conductive lines and a first one of said second conductive lines that is adjacent to said first one of said first conductive lines.

* * * * *